US006334971B1

(12) United States Patent
Huang (10) Patent No.: US 6,334,971 B1
(45) Date of Patent: Jan. 1, 2002

(54) MANUFACTURING METHOD FOR DIODE GROUP PROCESSED BY INJECTION MOLDING ON THE SURFACE

(76) Inventor: Wen-Ping Huang, 4F, No. 18, Lane 101, Sec1 Chi-Lung Rd., Taipei (TW)

( * ) Notice: Subject to any disclaimer, the term of this patent is extended or adjusted under 35 U.S.C. 154(b) by 0 days.

(21) Appl. No.: 09/620,069

(22) Filed: Jul. 20, 2000

(51) Int. Cl.[7] ........................... B29C 70/70; B29C 45/14
(52) U.S. Cl. ................. 264/157; 264/263; 264/272.14; 264/272.15; 264/272.17; 29/835; 438/110; 438/112
(58) Field of Search .................... 29/825, 829, 832, 29/835, 841, 846; 264/157, 263, 272.11, 272.14, 272.15, 272.17; 257/676, 711; 438/110, 111, 112, 113, 125, 126

(56) References Cited

U.S. PATENT DOCUMENTS

| | | | | |
|---|---|---|---|---|
| 4,113,981 A | * | 9/1978 | Fujita et al. ................. | 252/511 |
| 4,872,934 A | * | 10/1989 | Kameda ....................... | 156/250 |
| 5,235,741 A | * | 8/1993 | Mase .......................... | 29/830 |
| 5,491,111 A | * | 2/1996 | Tai .............................. | 438/113 |
| 5,614,131 A | * | 3/1997 | Mukerj et al. .......... | 264/272.17 |
| 5,799,392 A | * | 9/1998 | Mishiro ........................ | 29/830 |
| 5,855,924 A | * | 1/1999 | Lumbard ............... | 264/272.14 |
| 6,100,104 A | * | 8/2000 | Haerle ......................... | 438/113 |
| 6,107,162 A | * | 8/2000 | Morita et al. ................ | 438/113 |
| 6,117,347 A | * | 9/2000 | Ishida .......................... | 438/113 |
| 6,121,676 A | * | 9/2000 | Solberg ....................... | 257/686 |
| 6,174,751 B1 | * | 1/2001 | Oka ............................. | 438/113 |
| 6,225,688 B1 | * | 5/2001 | Kim et al. ................... | 257/686 |
| 6,226,862 B1 | * | 5/2001 | Neuman ....................... | 29/830 |

* cited by examiner

Primary Examiner—Angela Ortiz
(74) Attorney, Agent, or Firm—Bacon & Thomas (57) ABSTRACT

A manufacturing method for a diode group processed by injection molding on the surface thereof, the diode group is formed by having a plurality of left and right elongate tapes which are pressed to form respectively left and right contact ends, each pair of the left and right elongate tapes have a left lap end and a right lap end to sandwich a chip therebetween. Then injection molding is performed to envelop the left and right elongate tapes and to form an elongate strip having an insulation outer layer with the left and right contact ends exposed and with a recess at the bottom of and between every two neighboring chips. The recesses separate the left contact ends of the left elongate tapes from the right contact ends of the right elongate tapes but still leave the plural diodes in series connected mutually in an insulation state. The strip can be broken off at desire recesses to get a diode group having desired number of diodes processed by injection molding on the surface of the strip.

8 Claims, 11 Drawing Sheets

MANUFACTURING METHOD FOR DIODE GROUP PROCESSED BY INJECTION MOLDING ON THE SURFACE

BACKGROUND OF THE INVENTION

1. Field of the Invention

The present invention is related to a manufacturing method for a diode group processed by injection molding on the surface thereof, and especially to a method wherein a plurality of left and right elongate tapes are combined with a plurality of chips, then injection molding is performed to envelop them and to form an elongate strip with a recess between every two neighboring chips. When in use, breaking off is done at some of the recesses to get a diode group processed by injection molding on the surface thereof having desired number of diodes.

2. Description of the Prior Art

Diodes are essential electronic accessories for most of electronic products and instruments; a diode has the function of cutting off waves and current rectifying, so that the electronic products can be more stable in use. Diodes for different electronic products are also different, they may be individually used, or may be used in twos or in larger numbers, number of diodes in use is not certain. A product requiring a plurality of diodes must have the diodes assembled one by one, the distances between every two diodes have to be adjusted to avoid collision by overly closeness or to avoid too much space occupying or difficulty of wiring by overly large spacing. Thereby, there are problems technically in manufacturing and using of diodes.

Figure 1A:
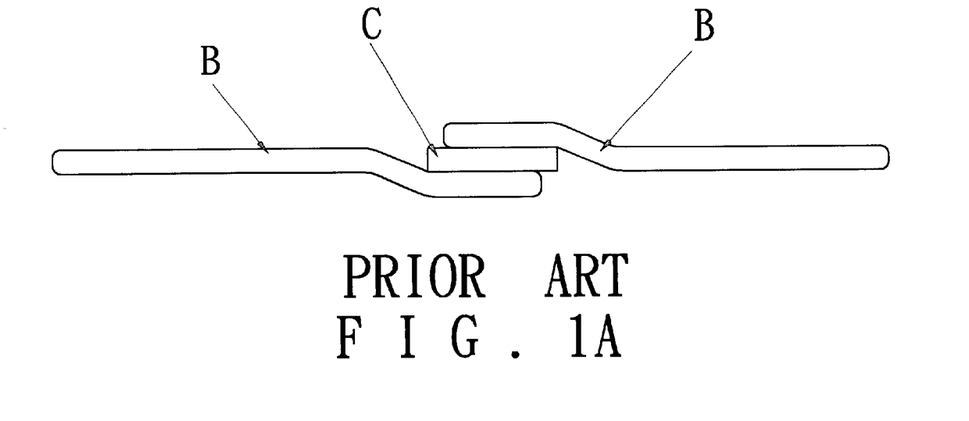
FIGS. 1A, 1B and 1C are a series of sectional views showing the processes of a conventional mode of manufacturing.
Figure 1B:
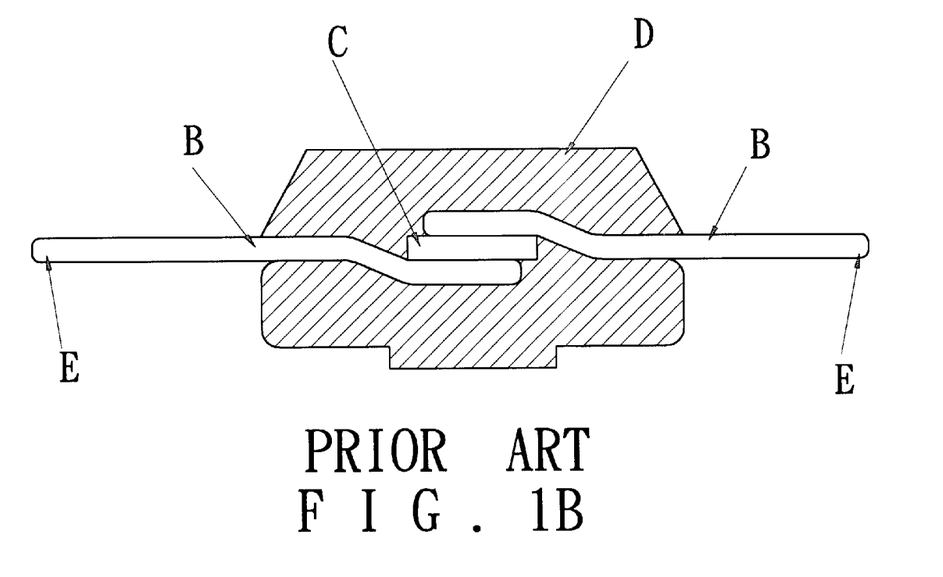
Figure 1C:
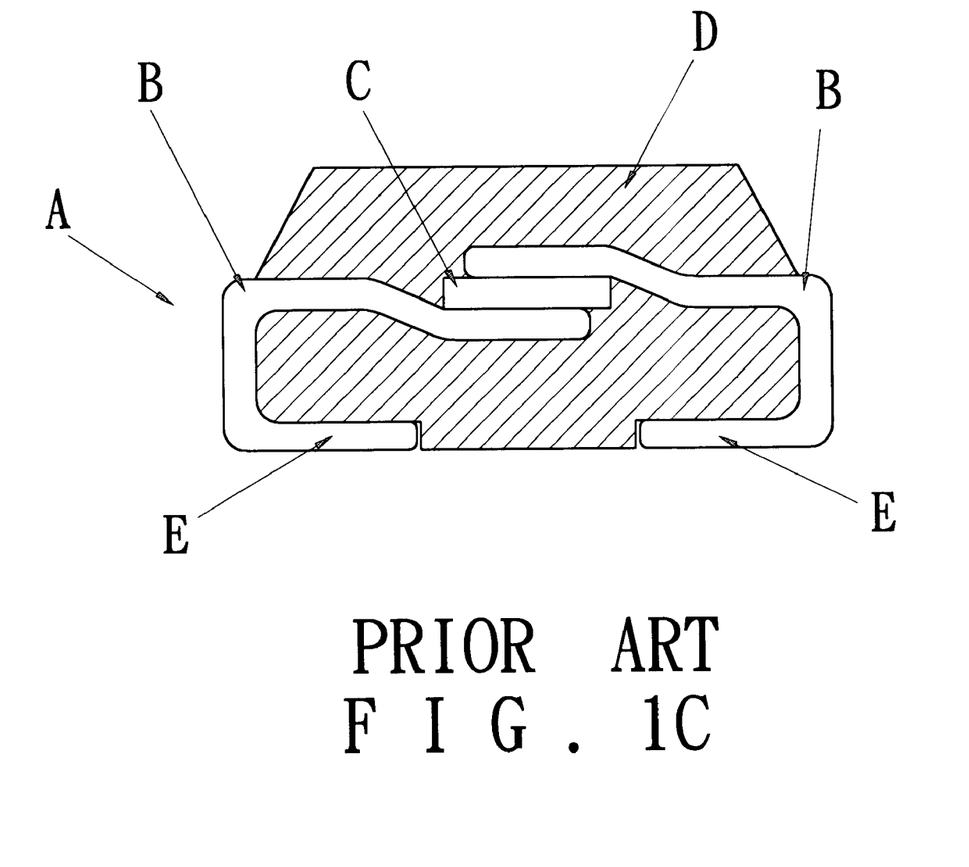

In the diodes available presently (referring to FIGS. 1A, 1B and 1C), a conductive piece B of a diode A is made singly by pressing forming, a chip C is provided between two conductive pieces B formed. Thereafter, the two conductive pieces Bare subjected to die molding to be enveloped by an insulation plastic layer D, after molding, the electrode pins E of the two conductive pieces B are bent onto the bottom of the insulation plastic layer D, thus a diode A is made.

However, the diodes A made in this mode are all individual, when an electronic product requires a plurality of diodes for use, the individuals have to be arranged and aligned one by one, time and manpower consumption is quite much, this increases cost of production and is uneconomic. Thus quite a many defects are resides therein:

1. The process of manufacturing gets individual diodes one by one, it is time and manpower consumptive, and efficiency of working is inferior.

2. After forming of the diodes, the pins of the conductive pieces must be bent onto the bottom of the insulation plastic layer, if they are bent unsymmetrically, the diodes formed may each has its right and left sides positioned at different levels. When the diodes are placed on an electric circuit board, they are subjected to swaying, if they are not well connected, current flow may be influenced.

3. The diodes are all manufactured individually, and are all more bulky, thereby, when it is to use a plurality of diodes, the diodes must be arranged and aligned one by one, the positions, spacing, space occupying etc. shall all be under consideration, operators may feel inconvenience and time and manpower consumptive.

4. When the plural diodes are mounted one by one on the electric circuit board, each diode must be checked to see whether they are separated, whether the pins are lapped over one another, this is to avoid errors, but this increases operating time of the operators.

5. The pins of the diodes must be bent during manufacturing, this increases the rate of breakage or undue bending of the pins, thereby increases the rate of inferiority and results waste of resources.

In view that the bother resided in the conventional manufacturing of diodes and the problems induced in using can both badly influence quality of the diodes, they must be well improved.

SUMMARY OF THE INVENTION

Therefore, the inventor of the present invention developed the manufacturing method of diodes based on his specific experience of designing, manufacturing and selling of the same kind of products for many years, and after devoting very much mind to study, improvement, development and many tests, examinations and tries.

The primary object of the present invention is to have a plurality of left and right elongate tapes combined with a plurality of chips, then injection molding is performed to envelop them and to form an elongate strip with a recess between every two neighboring chips. When in use, breaking off is done at some of the recesses to get a diode group processed by injection molding on the surface thereof having desired number of diodes.

The secondary object of the present invention is to align the diodes in strips, the diodes are spaced apart to avoid mutual interference, thus bother in arranging the diodes can be reduced.

Another object of the present invention is to take desired amount of diodes from the strips in pursuance of requirement, and put them on an electric circuit board, it is not necessary to adjust the spacing between every two diodes, working hour of operators can thus be reduced, and bother of aligning the diodes one by one can be saved.

The present invention will be apparent in its particular structure and objects after reading the detailed description of the preferred embodiments thereof in reference to the accompanying drawings.

DETAILED DESCRIPTION OF THE PREFERRED EMBODIMENT

Figure 2:
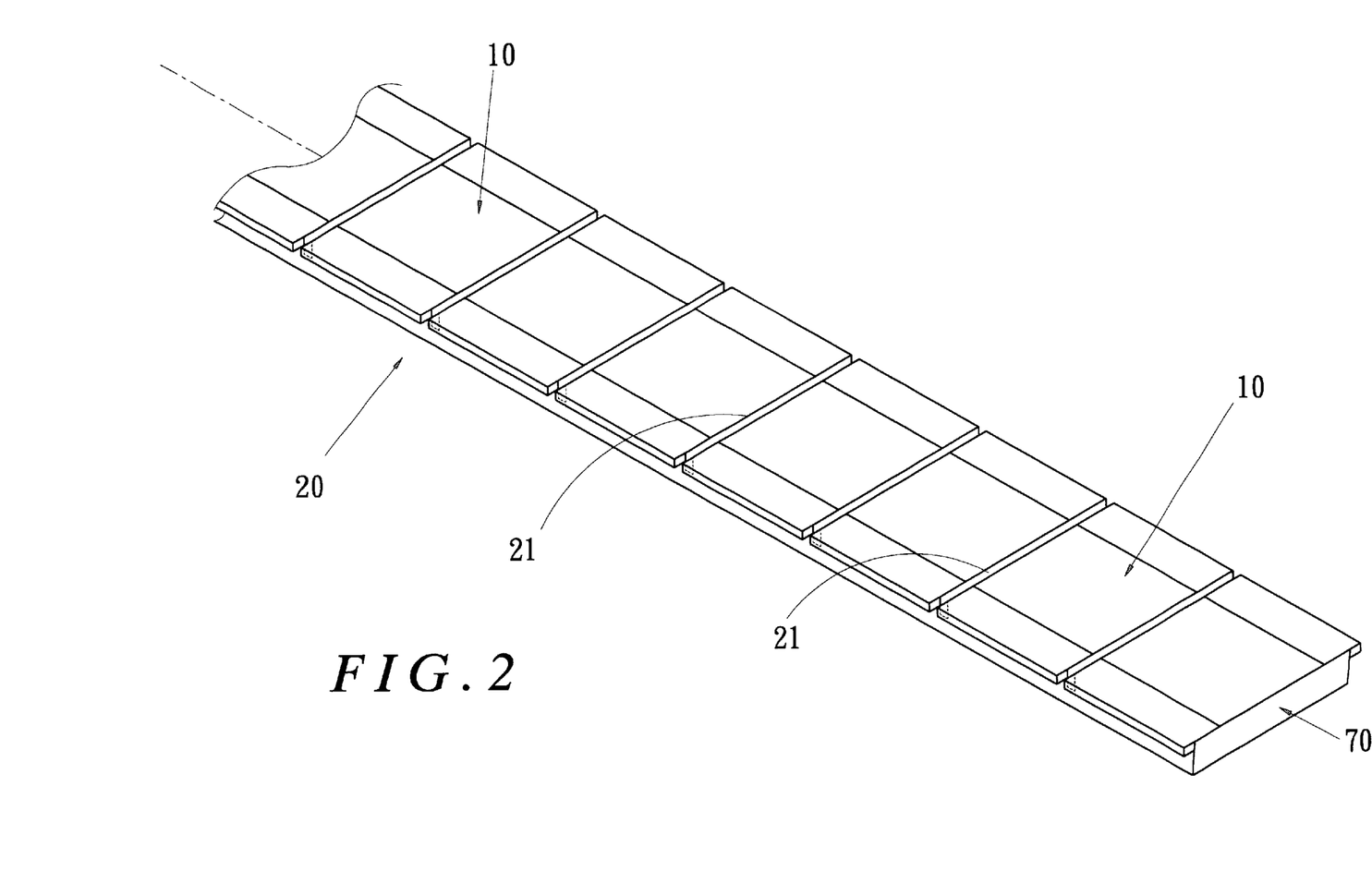
FIG. 2 is a perspective view showing diodes of the present invention in a strip.
Figure 3:
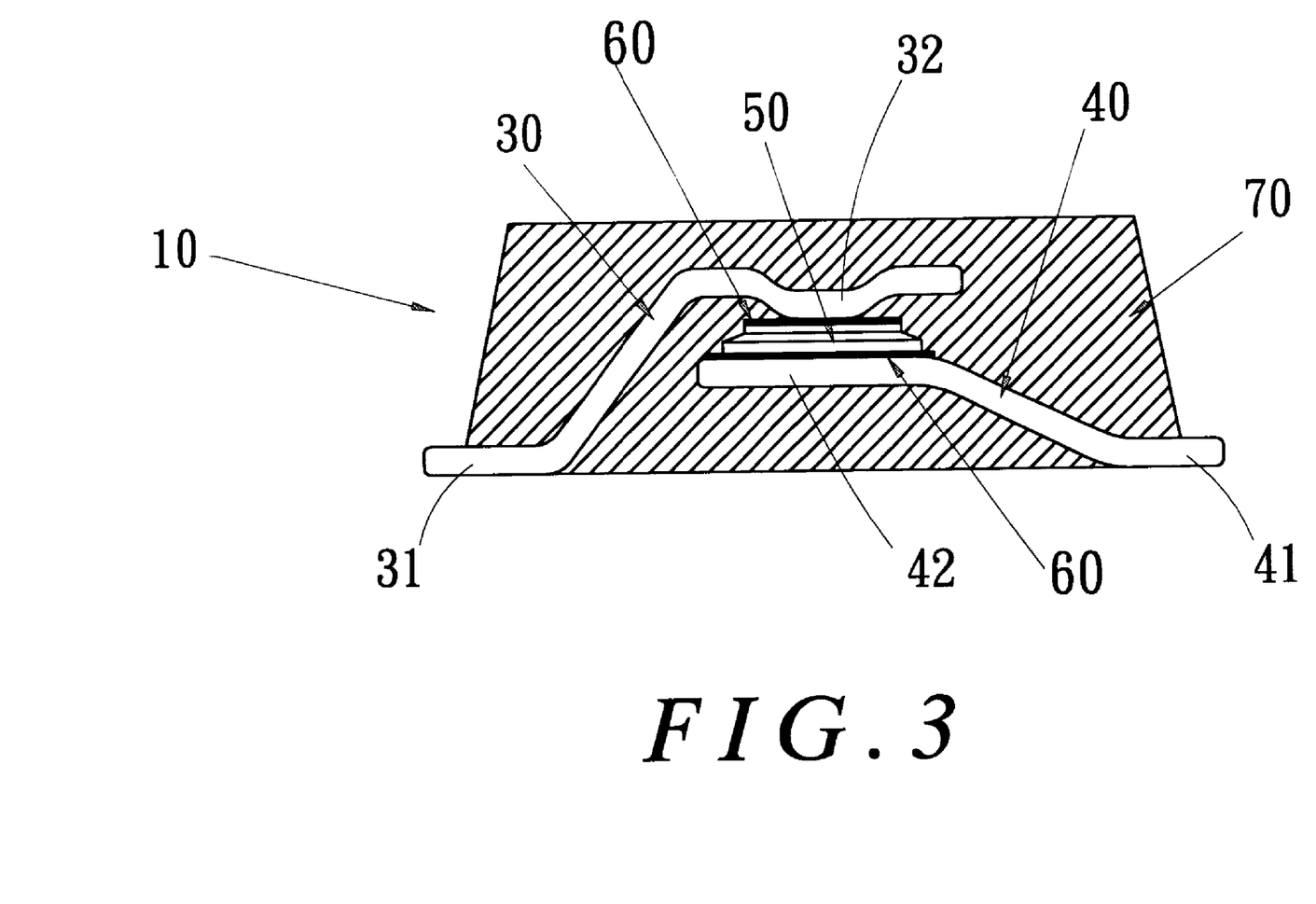
FIG. 3 is a sectional view showing the structure of a diode of the present invention.
Figure 4:
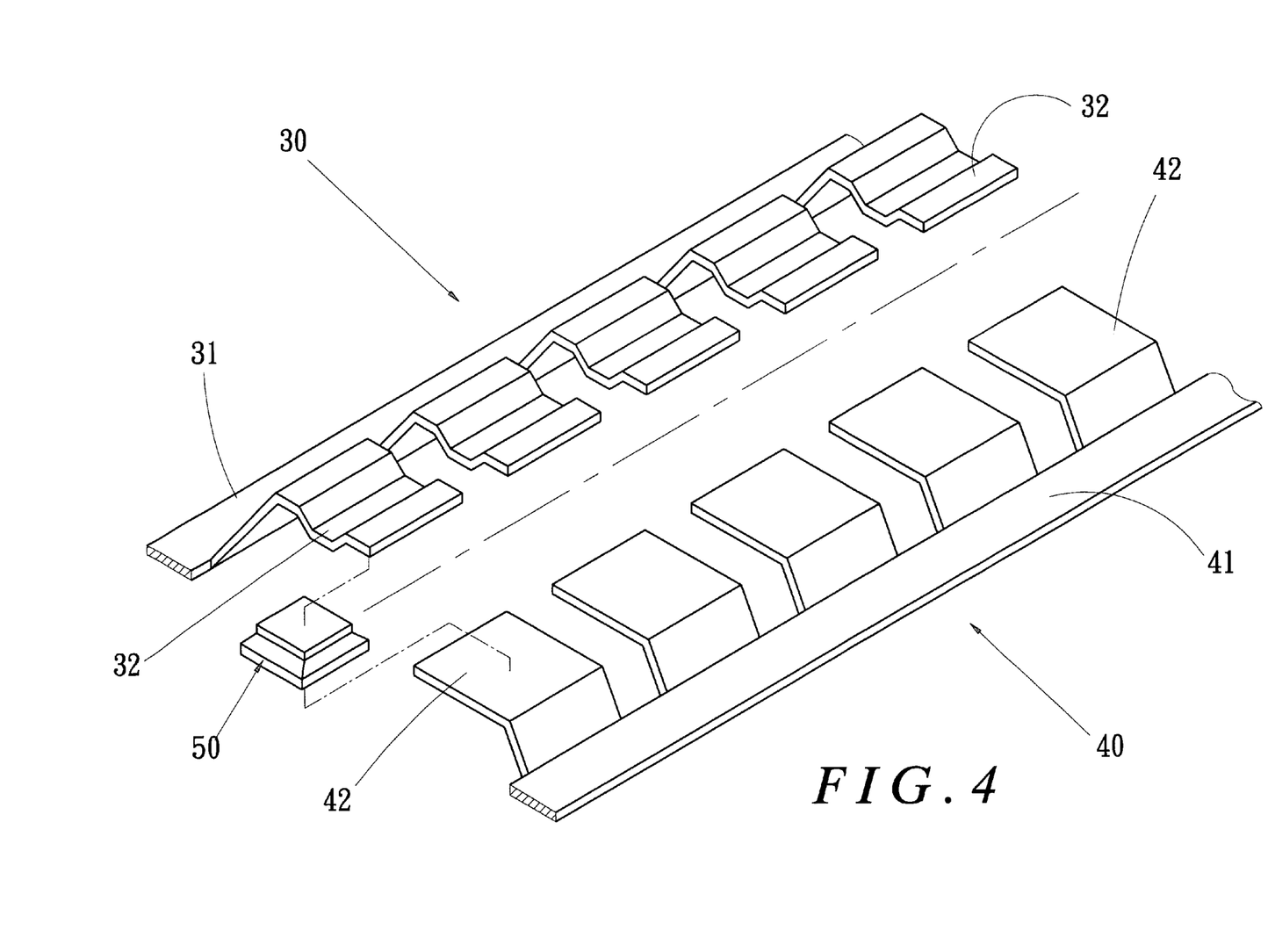
FIG. 4 is an analytic perspective view showing the structure of diodes of the present invention in a strip.

Referring to FIGS. 2, 3 and 4, a strip 20 formed of diodes 10 of the present invention is formed by having a plurality of left elongate tapes 30 and right elongate tapes 40 which are pressed to form respectively left contact ends 31 and right contact ends 41, each pair of the left and right elongate tapes 30, 40 have a left lap end 32 and a right lap end 42 to sandwich a chip 50 therebetween. Then injection molding is performed to envelop the left and right elongate tapes 30, 40 and to form an elongate strip 20 having an insulation outer layer 70 with the left and right contact ends 31, 41 of the left and right elongate tapes 30, 40 exposed and with a recess 21 at the bottom of and between every two neighboring chips 50. The recesses 21 separate the left contact ends 31 of the left elongate tapes 30 from the right contact ends 41 of the right elongate tapes 40 but still leave the plural diodes 10 in series connected mutually in an insulation state. The strip 20 with diodes 10 can be broken off at desire recesses 21 to get a diode group having the desired number of diodes 10 and processed by injection molding on the surface of the strip 20.

Referring again to FIGS. 3 and 4, the diodes 10 of the present invention each is comprised of a left elongate tape 30, a right elongate tape 40 and a chip 50.

Wherein, the left elongate tape 30 has a left lap end 32 and is integrally connected with a left contact end 31 which connects a plurality of left elongate tapes 30 each having a left lap end 32.

The right elongate tape 40 has a right lap end 42 and is integrally connected with a right contact end 41 which connects a plurality of right elongate tapes 40 each having a right lap end 42.

The chip 50 is placed between a corresponding left lap end 32 and a corresponding right lap end 42, and is connected with the left lap end 32 and the right lap end 42.

Figure 5:
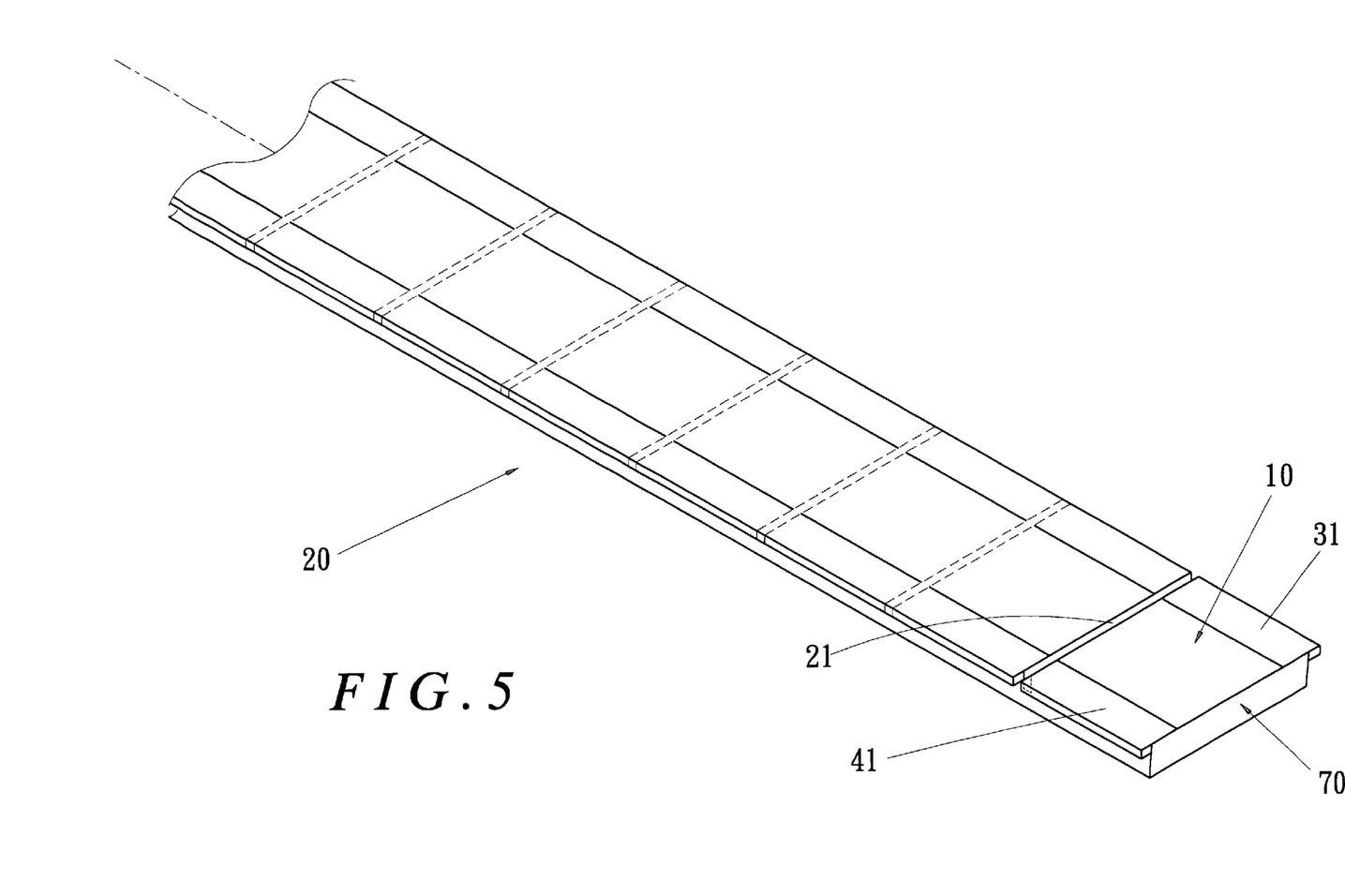
FIG. 5 is a schematic view showing providing of a plurality of recesses on the strip with diodes of the present invention.
Figure 6:
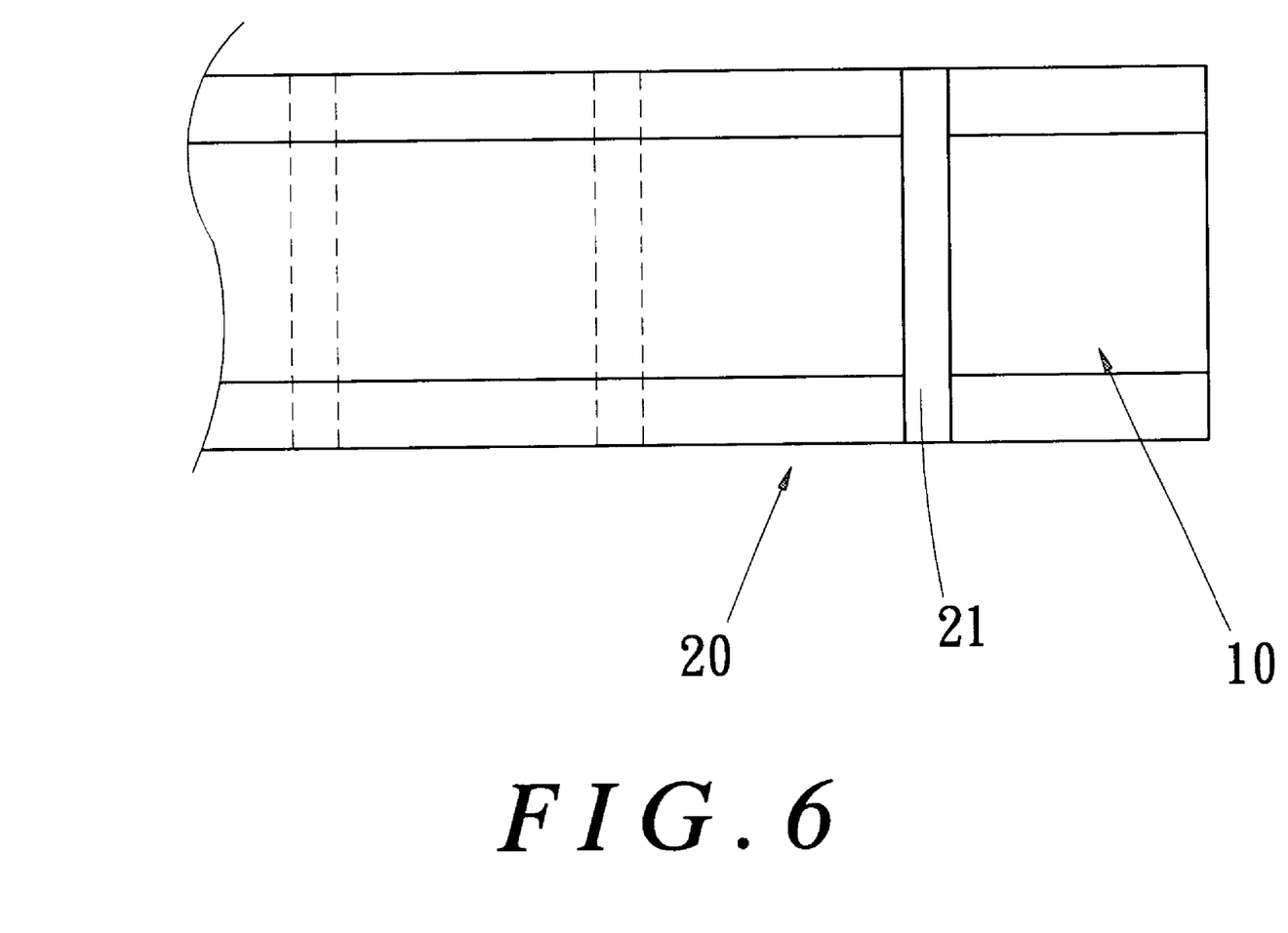
FIG. 6 is a plane view showing providing the recesses on the strip with diodes of the present invention.
Figure 7:
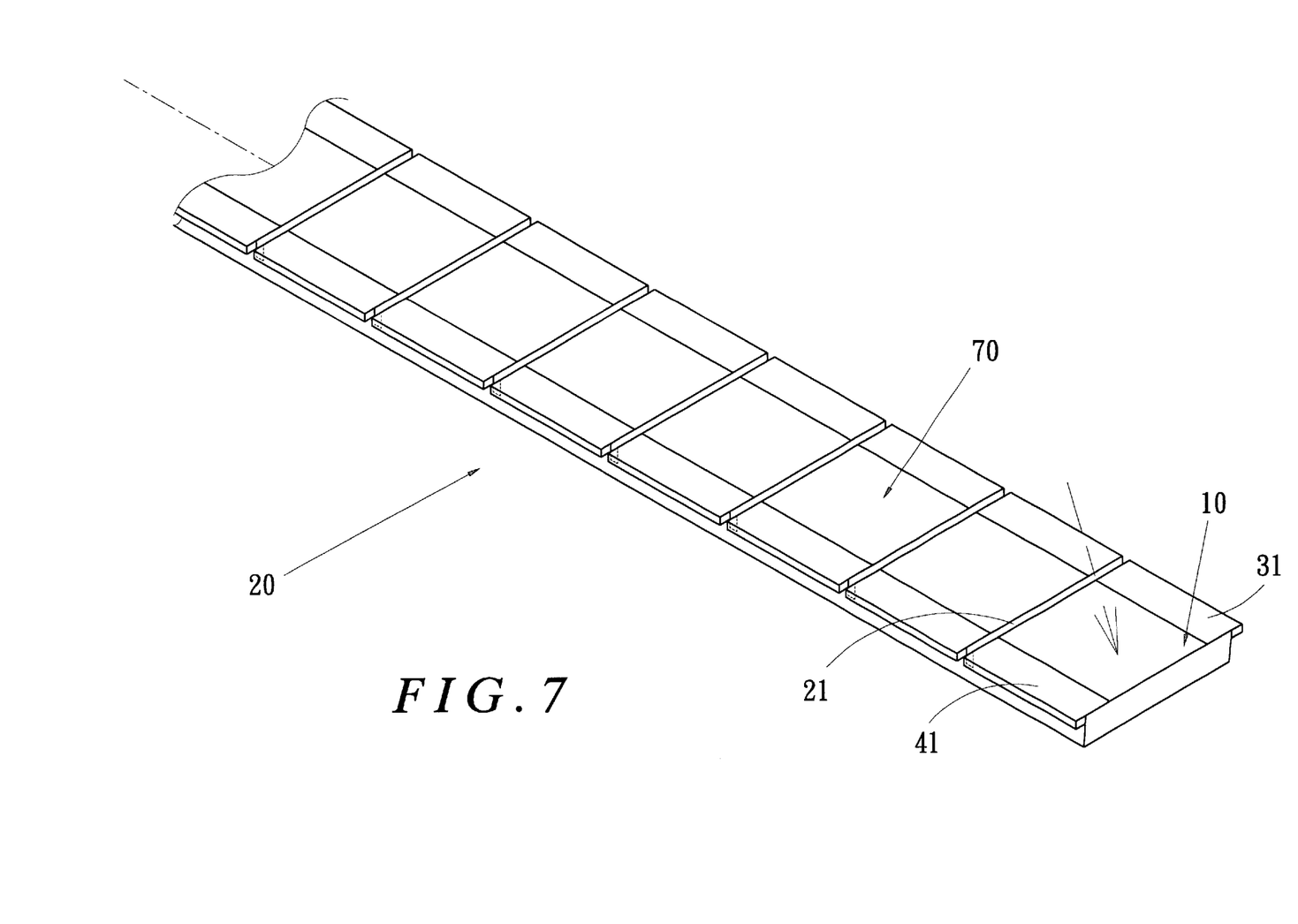
FIG. 7 is a schematic view showing breaking off the recesses on the strip with diodes of the present invention.
Figure 8:
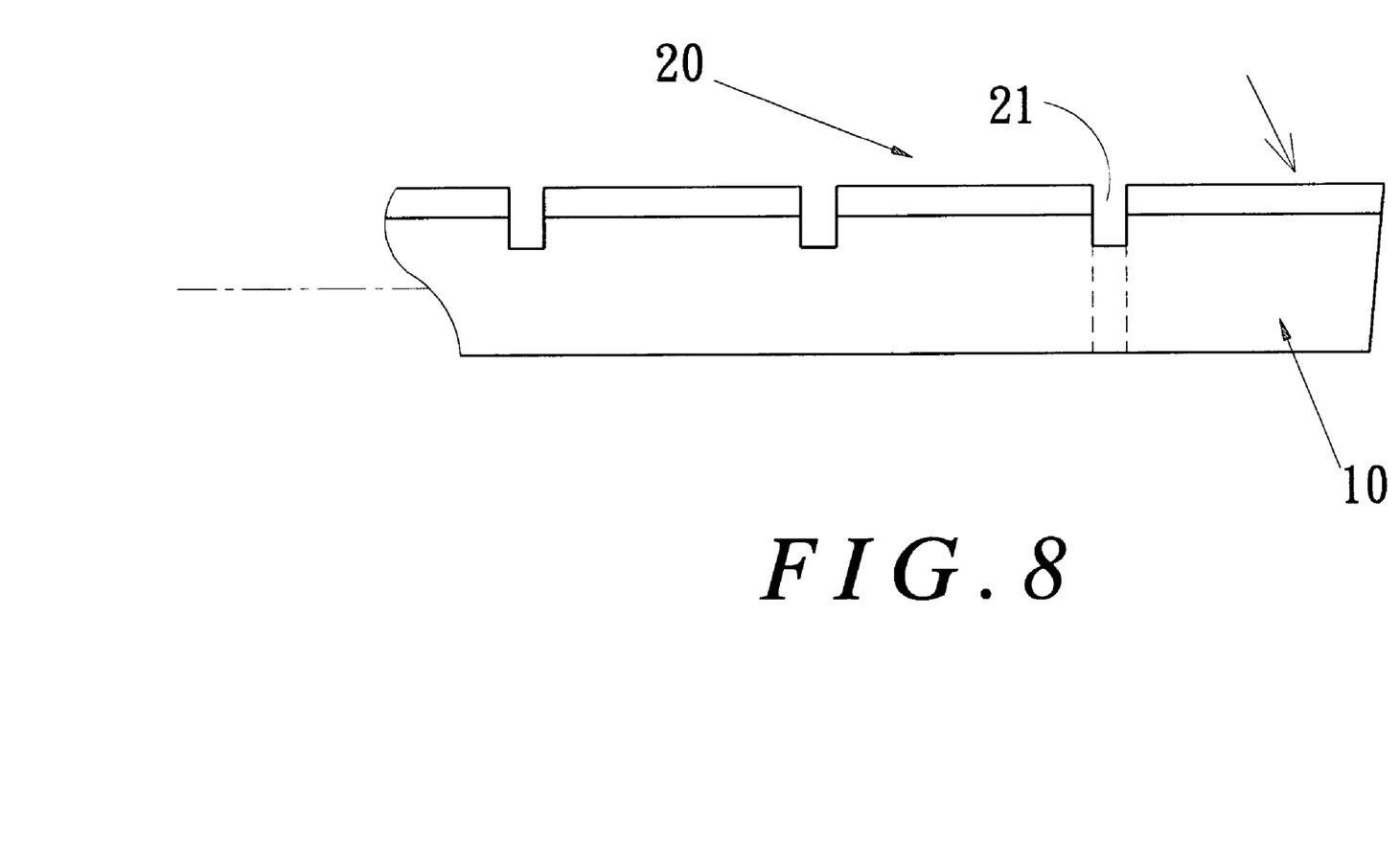
FIG. 8 is a side view showing breaking off the recesses on the strip with diodes of the present invention.
Figures 9A, 9B, 9C, 9D:
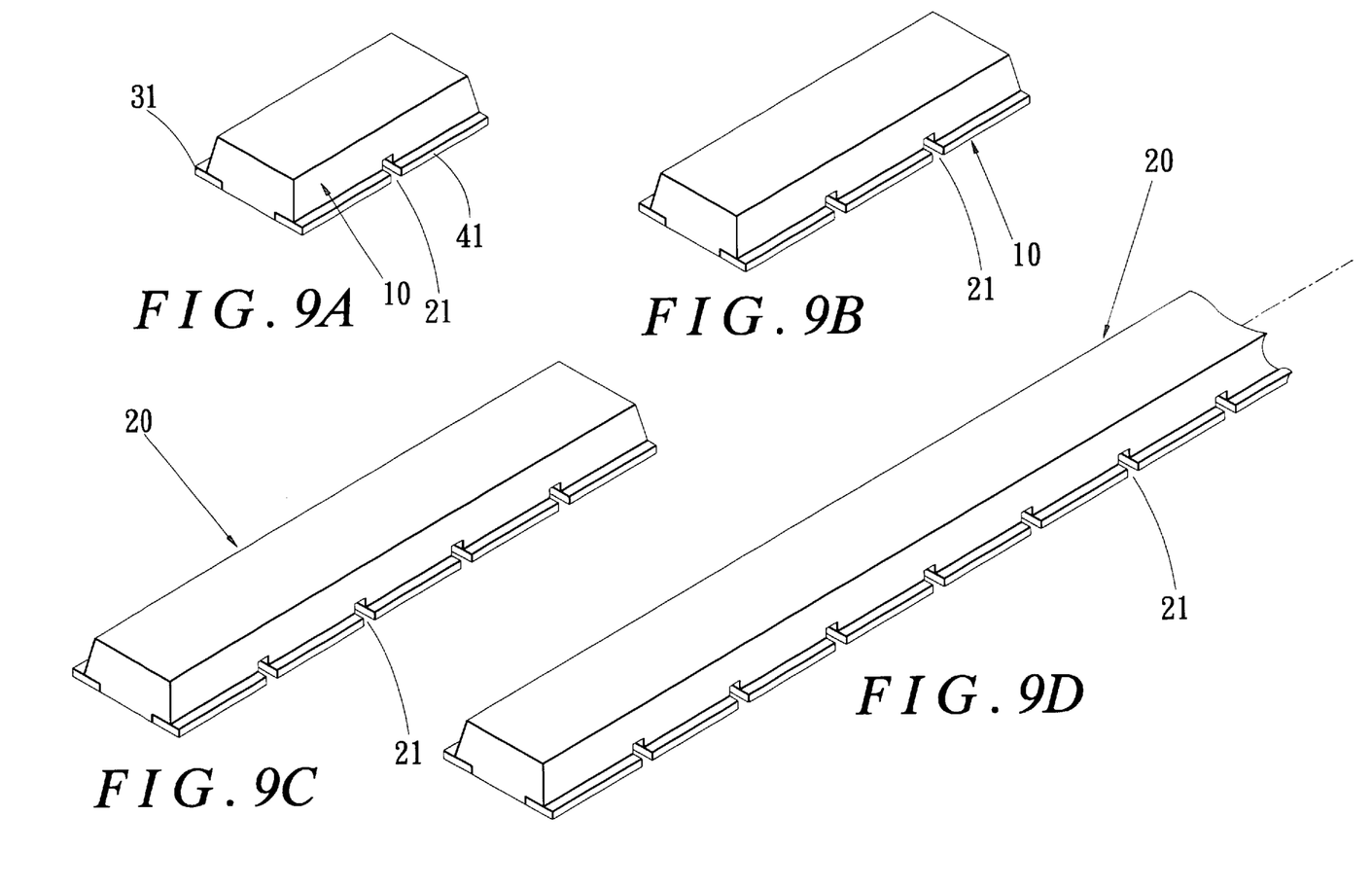
FIGS. 9A, 9B, 9C and 9D are perspective views respectively of four groups of diodes with different numbers of diodes of the present invention when they are finished from manufacturing.
Figure 10:
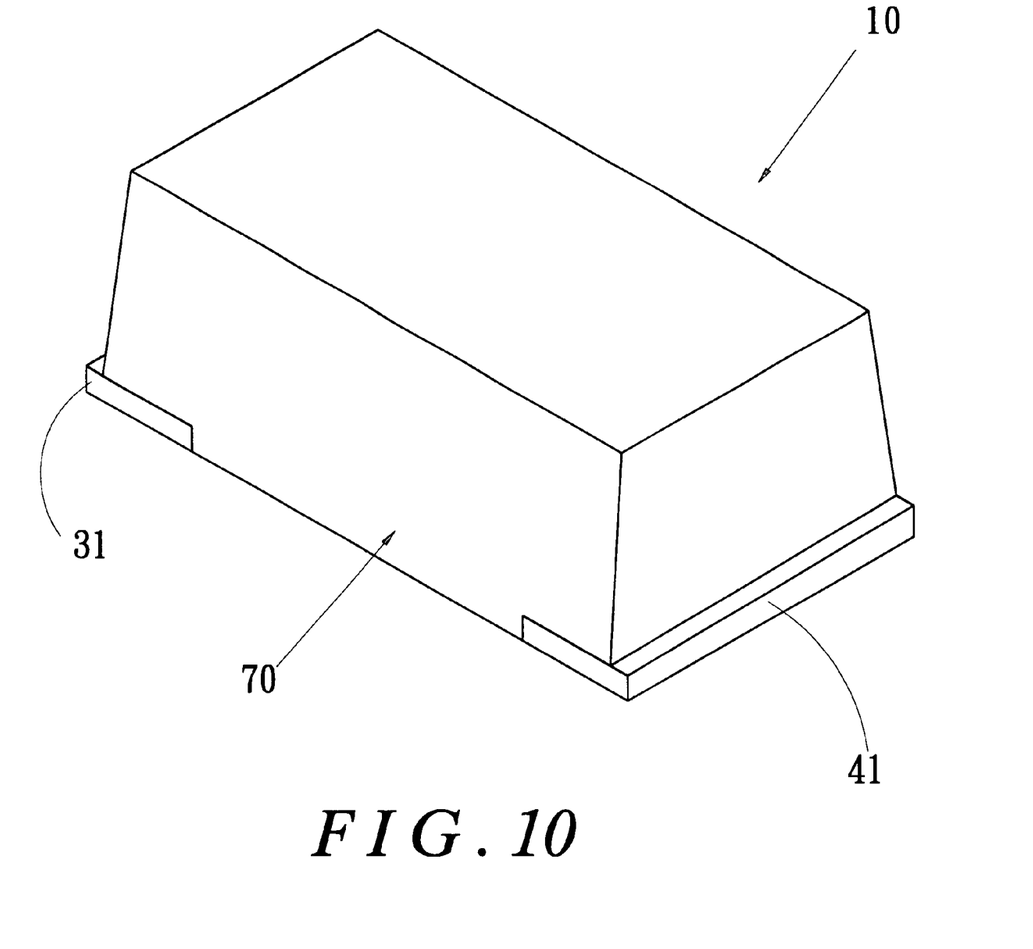
FIG. 10 is a perspective view showing a finished diode of the present invention in use.

With the above stated members, the left lap end 32 and the right lap end 42 on the left and right elongate tapes 30, 40 are placed in opposite to each other, then the chip 50 is placed between the left lap end 32 and the right lap end 42 to connect both, and then an insulation outer layer 70 is added over the plural left elongate tapes 30 and right elongate tapes 40 by injection molding and form integrally therewith to get a strip 20 with diodes 10 (as shown in FIGS. 4, 5, 6). Thereafter, a recess 21 is made at the bottom of and between every two neighboring chips 50 on the strip 20. The left contact ends 31 and the right contact ends 41 can be cut to thereby separate the left elongate tapes 30 from its neighboring right elongate tapes 40, and the strip 20 having the desired number of diodes 10 can be formed (as shown in FIGS. 3, 7, 8).

The chip 50 placed between the left lap end 32 and the right lap end 42 respectively of the left elongate tapes 30 and the right elongate tapes 40 can be directly welded to the left lap end 32 and the right lap end 42, and can be fixed by an electric conductive adhesive layer 60 (as shown in FIG. 3).

And as shown in FIGS. 9A, 9B, 9C, 9D and 10, when in use of diodes 10, the amount of diodes 10 is chosen from the strip 20 with diodes 10, and recesses 21 chosen are broken off, then the diodes 10 of the desired amount are obtained. In the diodes 10 taken off, the electric circuit board of each diode 10 is individual, two neighboring diodes 10 are connected with but insulated from each other; thereby, the diodes 10 will not interfere mutually in use.

The present invention has a strip with diodes made from a plurality of left elongate tapes and right elongate tapes serially arranged, a plurality of recesses are provided on the strip; so that when in using diodes, the diodes of desired amount can be obtained by breaking off the recesses provided on the strip. Every two neighboring diodes are kept a space therebetween; it is not necessary to adjust the space when in use, thus the present invention is quite convenient and practical for use.

Having thus described my invention, what I claim as new and desire to be secured by Letters Patent of the United States are:

1. A manufacturing method for processing a group of diodes by injection molding on the surface thereof, said method comprising the following steps:
   1) providing separate left and right elongated tapes, and pressing said left and right elongated tapes to form left lap ends and right lap ends, respectively;
   2) sandwiching a diode between each corresponding one of said left lap ends and each corresponding one of said right lap ends;
   3) performing injection molding to envelop said left and right elongate tapes to form an elongated strip having an insulated outer layer, leaving said left and right elongated tapes partially exposed to provide a left and right contact end, respectively; and
   4) electrically isolating each one of said diodes by forming a recess at the bottom of and between every one of said diodes.

2. A manufacturing method for processing a group of diodes by injection molding on the surface thereof, said method comprising the following steps:
   1) providing a plurality of left elongated tapes and right elongated tapes, and pressing said left and right elongated tapes to form left lap ends and right lap ends, respectively;
   2) sandwiching a diode between each corresponding one of said left lap ends and each corresponding one of said right lap ends;
   3) performing injection molding to envelop said left and right elongate tapes to form an elongated strip having an insulated outer layer leaving said left and right elongated tapes partially exposed to provide a left and right contact end, respectively;
   4) forming a recess at the bottom of and between every two neighboring ones of said diodes, said recesses separate said left contact ends of said left elongate tapes from said right contact ends of said right elongate tapes such that said diodes are insulated from each other but are still mutually connected in series;
   5) breaking said strip at said recess corresponding to a desired number of said diodes to get a diode group;
      wherein, said diode between said corresponding left lap end and said corresponding right lap end of each pair of said left and right elongate tapes is directly lap fixed to said left lap end and said right lap end, respectively.

3. A manufacturing method for processing a group of diodes by injection molding on the surface as claimed in claim 1, said method having the further step of welding said diode to the left lap end and the right lap end.

4. A manufacturing method for processing a group of diodes by injection molding on the surface as claimed in claim 1, said method having the further step of fixing said diode to the left lap end and the right lap end with an electric conductive adhesive layer.

5. A manufacturing method for processing a group of diodes by injection molding on the surface as claimed in claim 1, said method having the further step of:

5) breaking said strip at said recess corresponding to a desired number of said diodes to get a diode group.

6. A manufacturing method for processing a group of diodes by injection molding on the surface as claimed in claim 1, wherein the step of forming a recess separates said left contact ends of said left elongate tapes from said right contact ends of said right elongate tapes such that said diodes are still mutually connected in series.

7. A manufacturing method for processing a group of diodes by injection molding on the surface as claimed in claim 2, said method having the further step of welding said diode to the left lap end and right lap end.

8. A manufacturing method for processing a group of diodes by injection molding on the surface as claimed in claim 1, said method having the further step of fixing said diode to the left lap end and right lap end with an electric conductive adhesive layer.

\* \* \* \* \*